PULSE GENERATOR

Filed Dec. 31, 1947

Inventor:
David J. Epstein,
by Merton D. Morse
His Attorney.

Patented Mar. 4, 1952 2,588,098

UNITED STATES PATENT OFFICE 2,588,098

PULSE GENERATOR

David J. Epstein, Boston, Mass., assignor to General Electric Company, a corporation of New York Application December 31, 1947, Serial No. 795,067

12 Claims. (Cl. 250—36)

Figure 1:
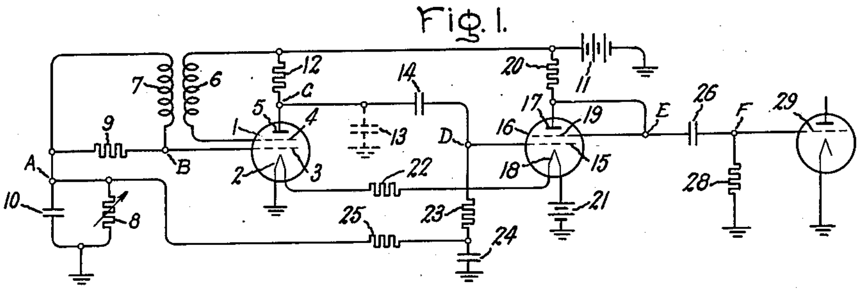

This invention relates to pulse generators, and more particularly to a pulse generator comprising a blocking oscillator for generating a wave form which is related to the impedance of a variable impedance element. The pulse generator of the invention is particularly adapted to the generation of telemetering signals.

An object of the invention is to provide an improved pulse generator controlled by a condition-responsive impedance.

Another object of the invention is to provide a generator arranged to generate under the control of, or in response to, the impedance of a variable impedance element, such as a temperature-sensitive resistor, a wave which is related in frequency to the value of such impedance by a simple mathematical equation. A specific object is to provide a generator which will produce oscillations at a frequency equal to the reciprocal of the sum of a constant plus the product of another constant and the resistance of a frequency determining variable resistance element.

A further object is to provide an improved blocking oscillator arranged to generate a series of pulses recurring at a rate determined by a condition response impedance incorporated in the oscillator circuit.

Another object is to decrease the size, weight, cost and complexity, and increase the stability and accuracy of telemetering signal generators, and to provide such a generator arranged so as to comprise only components which are readily obtainable commercially.

A still further object is to provide a generator for producing pulses of predetermined width recurring at intervals directly related to the impedance of a circuit element of the generator, and more particularly, such a generator wherein the effects upon the relationship due to changes in operating potentials are minimized.

An additional object is to provide an electronic switch particularly adapted to the control or modulation of a carrier wave oscillator in a telemetering transmitter.

An additional object is to provide an improved pulse generator comprising a blocking oscillator and a pulse shaping or amplifying tube biased by the oscillator so as to produce an output signal comprising pulses only of a predetermined polarity, and wherein the pulse shaping tube is not responsive to pulses of undesired polarity produced by the blocking oscillator.

The novel features which I believe to be characteristic of my invention are set forth with particularity in the appended claims. My invention itself, however, both as to its organization and method of operation, together with further objects and advantages thereof, may best be understood by reference to the following description taken in connection with the accompanying drawing, wherein Fig. 1 is a circuit diagram of a pulse generator in accordance with the invention, Fig. 2 is a group of curves exemplary of the operation of the circuit of Fig. 1, and Fig. 3 is a block diagram of a telemetering transmitter of the type to which the invention is particularly adapted.

Referring now to the drawings, the pulse generator shown in Fig. 1 comprises an electron discharge device 1 with a filamentary cathode 2, control electrode 3, screen electrode 4, and anode 5. Connected to the screen electrode is the primary winding 6 of a transformer of which the secondary 7 is connected between the control electrode 3 and a variable resistor 8, the other end of the resistor being connected to cathode 2 through ground. Winding 7 is shunted by a damping resistor 9, and a grid capacitor 10 is connected in parallel with variable resistor 8. Positive operating potentials for the discharge device 1 are provided from a suitable source, such as battery 11, anode 5 being connected thereto through load resistor 12 and the supply to screen electrode 4 being through transformer primary winding 6. The inherent circuit capacitance between anode 5 and ground is indicated in Fig. 1 as a capacitor 13 shown in dotted lines. Capacitance 13 includes the anode-to-ground interelectrode capacitance of discharge device 1, as well as the distributed capacitance of the circuit conductors.

A differentiating capacitor 14 serves to couple the anode 5 to the control electrode 15 of a second electron discharge device 16. Device 16 also includes an anode 17 and cathode 18, and, if desired, a screen electrode 19, which may be directly connected to the anode. Anode and screen electrode operating potentials are provided from battery 11 through a load resistor 20. Filamentary cathodes 2 and 18 may be excited by a series connection across a suitable low voltage source represented by battery 21 in series with a current limiting resistor 22 of known type. Control electrode bias for the tube 16 is obtained through a resistor 23 from storage capacitor 24. This capacitor forms, with filter resistor 25 a long time constant integrating circuit wherein the capacitor is charged to substantially the average potential of the underground terminal of capacitor 10. This potential is sufficient to bias discharge device 16 to cut-off, or beyond, whereby device 16 conducts only upon receipt of a positive pulse from the differentiating network comprising capacitor 14 and resistor 23. The anode output circuit of device 16 includes a coupling capacitor 26 and control electrode leak resistor 28 to provide the generated signal to a desired utilization circuit, which may, for example, include the control electrode 29 of an electron discharge device employed in the high frequency oscillator circuit of a telemetering signal transmitter.

Figure 2:
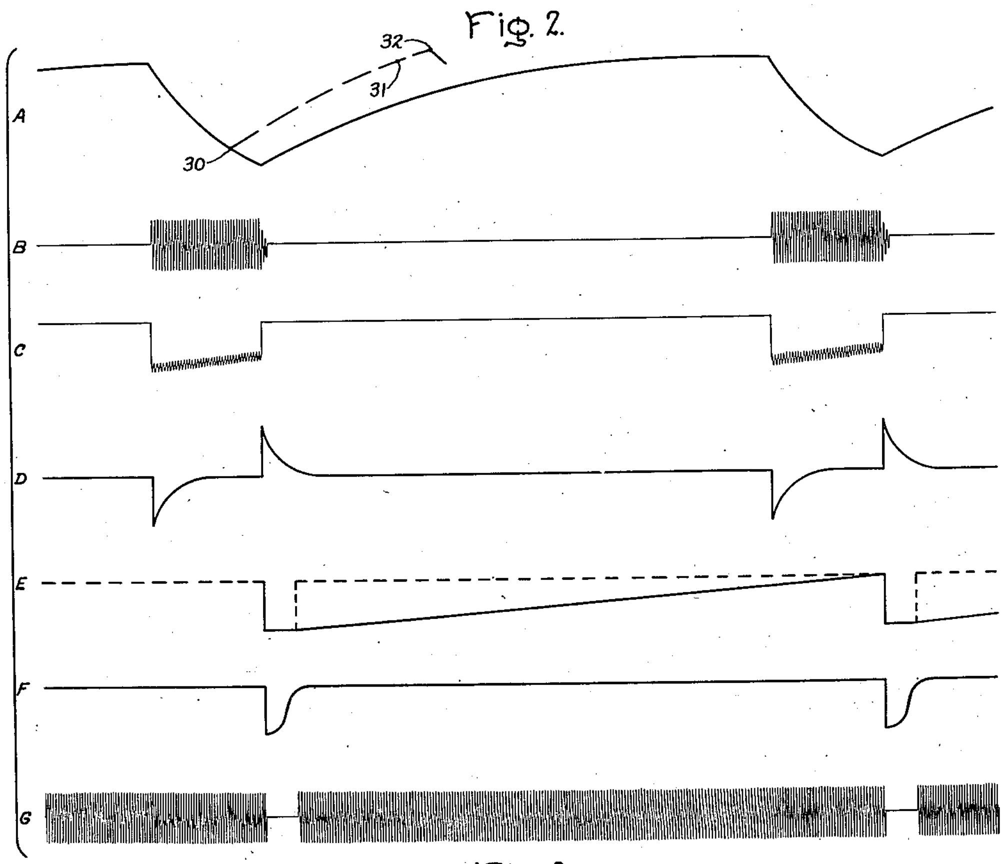
Figure 3:
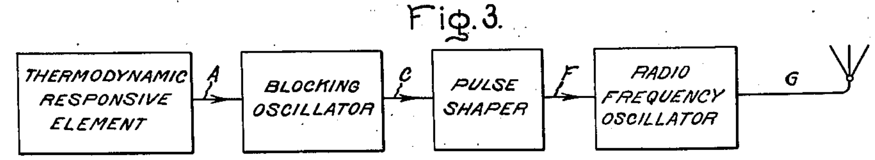

The operation of the device of Fig. 1 may be best understood with additional reference to Fig. 2, wherein curves representing the voltages occurring at juncture points in the circuit are represented. The curves are lettered to correspond to similarly lettered juncture points in the circuit diagram. The voltage appearing across capacitor 10 is represented by curve A and will be seen to rise and fall substantially exponentially. Assuming point A to be at a relatively low negative potential with respect to ground, oscillations will start in the control and screen electrode circuits comprising the windings 6 and 7 of the feedback transformer occurring at a relatively high frequency such as approximately 250 kilocycles, in the preferred embodiment of the invention. As long as oscillations occur in the discharge device 1, current is drawn by the control electrode through variable resistance element 8, and capacitor 10 is relatively rapidly charged, as indicated by the falling portion of curve A, to a predetermined greater negative potential which is sufficient to prevent conduction and oscillations in discharge device 1. As this potential is reached, conduction of control electrode 3, of course, ceases, and capacitor 10 relatively slowly discharges through resistor 8 at a rate determined by the value of the resistor 8 as indicated by the slowly rising portion of curve A. The discharge continues until point A reaches the potential, which may be only slightly negative with respect to ground, at which oscillations start once more. Thereafter point A relatively rapidly becomes more negative and provides the highly negative cut-off potential to the control electrode.

The voltage at point B disregarding the bias potential across capacitor 10, comprises groups or pulses of high frequency voltage occurring, of course, only during oscillations in the control electrode and screen electrode circuits, as shown in curve B of Fig. 2. The voltage produced across load resistor 12, appearing at point C, comprises a series of negative-going direct current pulses recurring at the same frequency as the cycles of operation of the circuit comprising capacitor 10 and resistance element 8. It will be apparent that the high frequency pulses shown in curve B persist throughout the charging period for capacitor 10 and that the negative-going pulses of curve C have a similar recurrence rate and duration. The inherent capacitance 13 is sufficient to prevent appearance of a substantial high frequency component at point C, although the total elimination of the component is not necessary. A capacitance element may be added in parallel to capacitance 13, if desired, to further reduce the high frequency component of the anode voltage.

Capacitor 14 and resistor 23 comprise a differentiating network for the negative pulses occurring on anode 5 and provide at point D the differentiation products, curve D, of the negative pulses, curve C. The control electrode of discharge device 16 is biased to the average value of the negative potential existing across capacitor 10, since storage capacitor 24 is charged through resistor 25, the values being chosen such that the time constant of the integrating circuit including capacitor 24 and resistor 25 is, preferably, several times larger than the time constant of the circuit comprising resistor 8 and capacitor 10 when resistor 8 is at maximum value. There is, accordingly, little variation in direct current bias potential for device 16 throughout a full cycle of charge and discharge of capacitor 10.

Since device 16 is maintained normally nonconductive because of the strongly negative bias across capacitor 24, the device is affected only by the positive-going pulses of curve D. The biasing potential applied to control electrode 15, and the time constant of the differentiating network comprising capacitor 14 and resistor 23 are so proportioned as to cause conduction of device 16 for a predetermined desired length of time, such as 100 microseconds, in response to each positive-going pulse. The positive-going pulses of curve D are preferably of sufficient intensity to drive device 16 to anode current saturation, and except for capacitor 26 and resistance 28, the signal appearing at point E would be a series of recurring negative-going square pulses, of, for instance, 100 microseconds width, such as are represented by dotted lines in curve E. It has been found necessary, however, in a particular application, to utilize a very low value, such as 400 ohms, for resistor 28, and the additional loading of the circuit comprising capacitor 26 and resistor 28 is such as to yield a voltage wave of the shape shown in full lines in curve E. By properly relating the values of capacitor 26 and resistor 28, however, it is possible to obtain a voltage at point F consisting of negative-going pulses which serve to bias control electrode 29 sufficiently negative for substantially 100 microseconds to prevent conduction and thereby stop oscillations in the equipment which includes the discharge device comprising control electrode 29, which as heretofore stated may be a radio frequency oscillator.

Variations in the value of resistor 8 will change the discharge time of capacitor 10, and thereby change the frequency of recurrence of the pulses shown in curves C, D, E and F, but neither the width of the pulses of curve C nor the frequency of the high frequency oscillations of the discharge device 1 is substantially affected by such variations. It has also been found that considerable variation in the values of voltage of batteries 11 and 21 can be tolerated without substantially changing the recurrence rate of the pulses; and this is of primary importance if small batteries are to be used of which the voltage falls substantially over an extended period of operation. It is, for instance, essential that there be little change in the recurrence rate if a device of the type described is to be used for radiosonde devices, wherein very light weight and a high degree of accuracy are both of great importance.

It will be understood that the anode potential varies during the cycles shown in curve A of Fig. 2 because of the variation in control electrode bias. If the screen electrode were connected to the anode, this variation would cause an additional time function to appear in the equation for the rate of generation of pulses. With the circuit shown in Fig. 1, however, the reciprocal of the repetition rate of the pulses is equal to a first constant plus the product of a second constant and the value of resistor 8. This relationship may be expressed as $$\frac{1}{t}=a+bR_8$$

where $t$ is the repetition rate, $a$ and $b$ are constants, and $R_8$ is the value of resistor 8. The first constant $a$ is representative of the time for charging of capacitor 10 to the cut-off potential of discharge device 1. This constant is maintained within narrow limits with battery potential variations. The second constant is determined primarily by the value of capacitor 10, and the product of this constant and the resistance value of resistor 8 is the discharge time constant of the network. Departures from the relationship between pulse rate and resistor value in practice are less than ½ of one percent for a range of 40,000 to 200,000 ohms for resistor 8.

The combination of resistor 25 and capacitor 24 connected across capacitor 10 tend to increase or improve the linearity of the relationship $$\frac{1}{t}=a+bR_8$$

The effect of this parallel circuit is to furnish a portion of the substantially constant negative potential stored in capacitor 24 to the control electrode circuit of device 1. The proportion of the potential thus provided is determined in part by the value of resistor 8, and tends to decrease with a decrease in value of the resistor.

At relatively low values of this resistor, the oscillations tend to stop at a somewhat less negative potential than with higher values because of the reduced impedance in the control electrode circuit. As seen in Fig. 2, the oscillations might stop at some point 30 and the discharge of capacitor 24 would take place along the dashed curve to a point 31 at the same potential as the peak of the solid curve representing operation at a higher value of resistor 8. The recurrence rate would be not in accord with the desired linear relationship by the amount represented by the horizontal distance between point 30 and the negative peak of the solid curve. This discrepancy is overcome, or reduced, since less negative bias, for a low value of resistor 8, is furnished from capacitor 24, and capacitor 10 discharges along the dotted curve to a new value of voltage at point 32 before oscillations are started again. The reestablished voltage limits of charge and discharge of capacitor 10, represented by points 30 and 32, accordingly, tend to correct any deviation from the desired relationship as the value of the resistor 8 is varied.

Suitable circuit constants for the elements of the device shown in Fig. 1 for operation as described may be as follows:

| Tubes 1 and 16 | Type 1L4 |
|---|---|
| Resistor 8 | 40,000–200,000 ohms (variable). |
| Resistor 9 | 10,000 ohms. |
| Resistor 12 | 1 megohm. |
| Resistor 20 | 0.1 megohm. |
| Resistor 22 | Approximately 50 ohms. |
| Resistor 23 | 1.2 megohms. |
| Resistor 25 | 7 megohms. |
| Resistor 28 | 400 ohms. |
| Capacitor 10 | .08 microfarad. |
| Capacitance 13 | Approximately 10 micromicrofarads. |
| Capacitor 14 | 50 micromicrofarads. |
| Capacitor 24 | .01 microfarad. |
| Capacitor 26 | 0.1 microfarad. |
| Battery 11 | 108 volts. |
| Battery 21 | 6 volts. |

The system outlined in block diagram 3 of a radiosonde transmitter is exemplary of one application of the circuit heretofore described. The block entitled "Thermodynamic Responsive Element" is representative of a variable impedance element such as the variable resistor 8 of Fig. 1. Such impedance may vary with temperature, humidity, pressure, or with some other parameter of the tested medium. The blocking oscillator includes the discharge device 1 of Fig. 1 and the circuits associated with its control, and anode screen electrodes. The pulse shaper is representative of the differentiating circuit 14, 23, electron discharge device 16 and the circuit elements associated therewith. The block labelled "Radio Frequency Oscillator" may represent equipment embodying a discharge device with a control electrode connected as is control electrode 29 shown in Fig. 1. In this case the radio frequency oscillator may be triggered on and off at the recurrence rate of the pulses of curves C, D, E and F, and the off periods of the oscillator may continue for 100 microseconds each, or such other predetermined time as may be obtainable by proportionment of the circuit elements of the device of Fig. 1. An antenna may be provided to transmit the radio frequency energy, shown in curve G generated by the radio frequency oscillator during its triggered on period. Signals provided from the respective devices represented in the block diagram to the next succeeding device may correspond to the signals represented by curves A, C and F, respectively, as indicated by the letters of the interconnections between the blocks in Fig. 3.

While I have shown only certain preferred embodiments of my invention by way of illustration, many modifications will occur to those skilled in the art and I therefore wish to have it understood that I intend, in the appended claims, to cover all such modifications as fall within the true spirit and scope of my invention.

What I claim as new and desire to secure by Letters Patent of the United States is:

1. A pulse generator comprising a first electron discharge device with an anode, a cathode, a control electrode and a screen electrode, a transformer with a primary winding connected in a circuit from said screen electrode to said anode and a secondary winding connected in another circuit from said control electrode to said cathode, an energy storage device connected for charging by conduction of said control electrode to provide a cut-off potential thereto when charged, adjustable means coupled to said storage device to discharge said storage device during non-conduction of said control electrode to thereby reinitiate conduction of said discharge device, said circuits being so constituted as to cause relatively high frequency oscillations therein during recurring conducting periods of said control electrode, a resistance element and capacitor connected in series across said energy storage device, the charging time constant of said element and capacitor being greater than the discharging time constant of said energy storage device and said means, and an anode-cathode circuit for said electron discharge device comprising a load resistance and sufficient capacitance to prevent the appearance of a substantial high frequency component across said load resistance.

2. A pulse generator comprising an oscillator with a feedback circuit arranged to oscillate at a high frequency, energy storage means coupled to said oscillator, means for rectifying oscillations generated by said oscillator, means for applying said rectified oscillations to said storage means for charging thereof, said storage means being arranged to affect the operation of said oscillator in accord with the extent of said charge, thermodynamic-responsive impedance means coupled to said storage means for discharging said storage means at a rate related to a characteristic of the medium in contact therewith, second energy storage means connected through a high impedance conductive element to said first storage means and having a time constant of the order of several times the maximum discharge time constant of said first storage means thereby to increase the linearity of the relationship between the period of recurrence of the affected operation of said oscillator and the variations of said thermodynamic-responsive means, and pulse forming means for providing pulses in accord with the oscillations in said oscillator.

3. In a pulse generator, an electron coupled blocking oscillator and a pulse selective device; said oscillator comprising an electron discharge device with a cathode, an anode, a control electrode and a screen electrode, a high frequency feedback circuit coupled between said screen electrode and said control electrode, energy storage means coupled to said control electrode for charging in response to control electrode current flow, means coupled to said storage means for dissipating the charge on said storage means at a rate lower than said high frequency, whereby said oscillator operates to generate high frequency energy during the time periods required to charge said storage means to the control electrode cutoff potential of said discharge device and is inoperative during the dissipation of the charge to a predetermined starting potential; said pulse selective device comprising a second electron discharge device with a control grid, an anode and a cathode; a differentiating network coupling said oscillator anode to said control grid, the time constant of said network being longer than the time constant of said feedback connection and less than that of said energy storage means shunted by said dissipating means; and an integrating network coupling said control electrode to said control grid, the time constant of said integrating network being greater than the time constant of said energy storage means as shunted by said dissipating means.

4. A pulse generator for generating pulses at a repetition rate which is inversely proportional to a constant plus the product of a second constant and the impedance of a variable impedance element, said generator comprising an electron discharge device with a cathode, an anode, a control electrode and a screen electrode, said anode circuit comprising a load resistance and a high frequency bypass capacitor to bypass high frequency energy around said load resistor, a high frequency blocking oscillator circuit connected to said cathode and comprising said screen and control electrodes with a high frequency feedback connection therebetween, a capacitor coupled to said oscillator circuit, means for rectifying the high frequency energy in said feedback circuit by control electrode current flow, means for applying said rectified energy to said capacitor to block said oscillator, a variable resistor for discharging said capacitor substantially during blocking of said oscillator, whereby direct current pulses are produce on said anode, a second resistor connected in series with said variable resistor to form a voltage divider circuit therewith, and means providing a substantially constant potential across said voltage divider circuit polarized to aid the said rectified charging of said capacitor, whereby the duration of each of said pulses is substantially independent of variations in resistance of said variable resistor and said pulses occur at a rate substantially linearly related to the resistance of said variable resistor plus a predetermined constant.

5. A pulse generator for generating pulses at a repetition rate which is inversely proportional to a constant plus the product of a second constant and the impedance of a variable impedance element, said generator comprising an electron discharge device with a cathode, an anode, a control electrode and a screen electrode, said anode circuit comprising a load resistance and a high frequency bypass capacitor to bypass high frequency energy around said load resistor, a high frequency blocking oscillator circuit connected to said cathode and comprising said screen and control electrodes with a high frequency feedback connection therebetween, a capacitor coupled to said oscillator circuit, means for charging said capacitor in response to control electrode current flow to block said oscillator, and a variable resistor for discharging said capacitor, whereby direct current pulses are produced on said anode, a second resistor connected in series with said variable resistor to form a voltage divider circuit therewith, and a second capacitor connected across said voltage divider circuit proportioned to have a time constant with the total resistance of said circuit several times the discharge time constant of said variable resistor and said first capacitor, whereby said second capacitor tends to remain charged to the average value of charge on said first capacitor and so affects the voltages of said first capacitor as to improve the linearity of the relationship between the period of recurrence of said pulses and the value of said first resistor.

6. A pulse generator for generating pulses at a repetition rate which is inversely proportional to a constant plus the product of a second constant and the impedance of a variable impedance element, said generator comprising an electron discharge device with a cathode, an anode, a control electrode and a screen electrode, said anode circuit comprising a load resistance and a high frequency bypass capacitor to bypass high frequency energy around said load resistor, a high frequency blocking oscillator circuit connected to said cathode and comprising means providing a feedback path between the screen electrode-anode electron discharge path and the control electrode-cathode electron discharge path, a capacitor coupled to said oscillator circuit and responsive to control electrode current flow to block said oscillator, and a variable resistor for discharging said capacitor, whereby direct current pulses are produced on said anode, a second resistor connected in series with said variable resistor to form a voltage divider circuit therewith, a second capacitor connected across said voltage divider circuit proportioned to have a time constant with the total resistance of said circuit several times the discharge time constant of said variable resistor and said first capacitor, whereby said second capacitor tends to remain charged to the average value of charge on said first capacitor and so affects the voltages of said first capacitor as to improve the linearity of the relationship between the period of recurrence of said pulses and the value of said first resistor, and a second electron discharge device comprising a control electrode coupled to said anode and biased by connection through an impedance to the potential of said second capacitor, whereby said second electron discharge device responds only to positive-going signals appearing on said anode.

7. An arrangement comprising a self-blocking oscillator for generating bursts of oscillations of a given frequency at a given repetition rate, an electron discharge device, said oscillator and device each comprising an input and an output circuit, said oscillator input circuit, means for charging and discharging said storage circuit at a rate comprising a storage circuit determining said repetition rate, said device input circuit comprising a time constant circuit responsive to the energy of said storage circuit and having a time constant sufficiently large for normally maintaining said device non-conductive and means for rendering said device conductive comprising means for applying the bursts of oscillations developed in said oscillator output circuit to said device input circuit.

8. An arrangement comprising a self-blocking oscillator for generating burst of oscillations at a given repetition rate, said oscillator comprising an electrical charge storage circuit and means for charging and discharging said storage circuit at a rate determining said repetition rate, an electron discharge device comprising an input circuit, means for rendering said device inoperative comprising a coupling circuit having a relatively larger time constant than said storage circuit for applying the voltage developed across said storage circuit to said input circuit, and means responsive to the bursts of oscillations developed in the output of said self-blocking oscillator for rendering said device operative.

9. In combination a source of oscillations of a given frequency, a storage circuit connected to said source, means for charging and discharging said storage circuit at different rates for interrupting said oscillations at a relatively lower frequency, an electron discharge device, means for normally rendering said device inoperative comprising a coupling circuit having a relatively long time constant as compared to that of said storage circuit connecting said device to said storage circuit, and means for rendering said device operative comprising a coupling circuit having a relatively short time constant as compared to that of said storage circuit connecting said device to the output of said source.

10. In combination an electron discharge device comprising an input and an output electrode, means for causing said device to oscillate at a given frequency comprising a feedback network connected between said output and said input network, a storage circuit connected to said input electrode for interrupting the oscillation of said device at a lower frequency, means for discharging and charging said storage circuit at a rate determining said lower frequency, a utilization circuit, means for rendering said utilization circuit inoperative comprising a coupling circuit having a time constant relatively larger than that of said storage circuit for applying the voltage developed across said storage circuit to said utilization circuit, and means responsive to the interrupted oscillations developed in the output of said device for rendering said utilization circuit operative.

11. In combination an electron discharge device comprising an input electrode and an output electrode, means for causing said device to oscillate at a given frequency comprising a feedback network connected between said output and said input electrode, means for interrupting the oscillation of said device at a relatively lower frequency comprising a storage circuit connected to said input electrode, said storage device responsive to a predetermined amount of input electrode current flow during oscillation of said device for rendering said device non-conductive, means for discharging said storage circuit to again render said device oscillatory after a given time interval, a utilization circuit, means for rendering said utilization circuit inoperative comprising a coupling circuit having a relatively long time constant as compared to that of said storage circuit for applying the voltage developed across said storage circuit to said utilization circuit, and means responsive to the interrupted oscillations developed in the output of said oscillating device for rendering said utilization circuit operative.

12. In combination an electron discharge device having an input and an output electrode, means for causing said device to oscillate at a given frequency comprising a feedback network connected between said output and said input electrode, means for interrupting the oscillation of said device at a lower frequency comprising a storage circuit connected to said input electrode, said storage device responsive to a predetermined amount of input electrode current flow during oscillation of said device for halting oscillation of said device, means for discharging said storage device to permit oscillation of said device, an electron discharge device having an input and an output circuit, a utilization circuit connected to the output circuit of said last-named device, means for rendering said second device inoperative comprising a coupling circuit having a longer time constant than said storage device for applying the voltage developed across said device to said input circuit, means for differentiating the interrupted oscillations developed in the output of said first-mentioned device, means for rendering said second device operative comprising means for applying said differentiated output to said input circuit.

DAVID J. EPSTEIN.

REFERENCES CITED

The following references are of record in the file of this patent:

UNITED STATES PATENTS

| Number | Name | Date |
|---|---|---|
| 1,919,985 | Patterson | July 25, 1933 |
| 2,287,786 | Diamond et al. | June 30, 1942 |
| 2,297,742 | Campbell | Oct. 6, 1942 |
| 2,325,927 | Wilbur | Aug. 3, 1943 |
| 2,366,307 | Anderson | Jan. 2, 1945 |

FOREIGN PATENTS

| Number | Country | Date |
|---|---|---|
| 235,254 | Great Britain | June 11, 1925 |
| 442,938 | Great Britain | Feb. 18, 1936 |